US012235290B2

(12) United States Patent
Shu

(10) Patent No.: US 12,235,290 B2
(45) Date of Patent: Feb. 25, 2025

(54) MULTI-LEVEL VOLTAGE DETECTOR

(71) Applicant: Texas Instruments Incorporated, Dallas, TX (US)

(72) Inventor: Keliu Shu, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/501,083

(22) Filed: Nov. 3, 2023

(65) Prior Publication Data

US 2024/0069073 A1    Feb. 29, 2024

Related U.S. Application Data

(62) Division of application No. 16/729,339, filed on Dec. 28, 2019, now Pat. No. 11,808,792.

(60) Provisional application No. 62/809,071, filed on Feb. 22, 2019.

(51) Int. Cl.
*G01R 19/00* (2006.01)
*H02M 1/00* (2006.01)
*G01R 15/00* (2006.01)

(52) U.S. Cl.
CPC ...... *G01R 19/0084* (2013.01); *H02M 1/0009* (2021.05); *G01R 15/002* (2013.01); *G01R 19/0023* (2013.01)

(58) Field of Classification Search
CPC .............. G01R 15/002; G01R 19/0023; G01R 19/0084; H02M 1/0009
USPC ......................................................... 702/64
See application file for complete search history.

(56) References Cited

U.S. PATENT DOCUMENTS

| 4,200,863 A | 4/1980 | Hodges et al. |
| 4,350,975 A | 9/1982 | Haque et al. |
| 4,517,549 A | 5/1985 | Tsukakoshi |
| 5,258,761 A | 11/1993 | Fotouhi et al. |
| 5,939,871 A * | 8/1999 | Tanaka ................ H02M 3/1563 323/290 |
| 5,969,515 A * | 10/1999 | Oglesbee .............. H02M 3/157 323/283 |
| 6,154,164 A | 11/2000 | Gross |
| 6,310,787 B2 | 10/2001 | Ito et al. |

(Continued)

FOREIGN PATENT DOCUMENTS

| CN | 206402093 U | 8/2017 |
| JP | 04313070 A | 11/1992 |

(Continued)

OTHER PUBLICATIONS

Search Report for PCT Application No. PCT/US2020/19488, mailed May 28, 2020, 1 page.

(Continued)

*Primary Examiner* — William Hernandez
(74) *Attorney, Agent, or Firm* — Frank D. Cimino

(57) ABSTRACT

In one example, a method comprises: receiving a voltage from a power converter, and generating a comparison result representing a comparison between the voltage and a voltage threshold. The method further comprises providing one of a first current reference or a second current reference to the power converter responsive to the comparison result, in which the first and second current references represent different current levels.

20 Claims, 8 Drawing Sheets

(56) References Cited

U.S. PATENT DOCUMENTS

| | | | | |
|---|---|---|---|---|
| 2007/0279820 | A1* | 12/2007 | Fang | H02H 7/1203 |
| | | | | 361/97 |
| 2015/0003119 | A1* | 1/2015 | Li | H02M 3/33507 |
| | | | | 363/21.13 |
| 2015/0061617 | A1 | 3/2015 | Archibald | |
| 2016/0259355 | A1* | 9/2016 | Farber | H03K 5/2481 |
| 2016/0352225 | A1* | 12/2016 | Langlinais | H02M 1/08 |
| 2017/0040895 | A1* | 2/2017 | May | G01R 19/165 |
| 2017/0098992 | A1* | 4/2017 | Weis | H02M 1/32 |
| 2017/0207711 | A1 | 7/2017 | Balakrishnan | |
| 2017/0310122 | A1* | 10/2017 | Chang | H02J 7/007 |
| 2018/0337597 | A1 | 11/2018 | Pazhayaveetil et al. | |
| 2022/0294208 | A1* | 9/2022 | Xu | H03K 17/0822 |
| 2022/0393570 | A1* | 12/2022 | Cimaz | H02M 1/32 |

FOREIGN PATENT DOCUMENTS

| | | |
|---|---|---|
| JP | H04313070 A | 11/1992 |
| JP | 2005331478 A | 12/2005 |
| JP | 2009128130 A | 6/2009 |
| KR | 20160083576 A | 7/2016 |

OTHER PUBLICATIONS

Extended Search Report for EP Application No. 20759535.6, dated Apr. 20, 2022, 10 pages.
National Intellectual Property Administration, PRC, Search Report, mailed Oct. 15, 2023, 28 pages.
European Patent Office, EP Search Report for T90671EP01, Jun. 26, 2024, 7 pages.

* cited by examiner

| VBST [V] | STATE | DECODER 1 ACTIVE OUTPUT | CMP | DECODER 2 ACTIVE OUTPUT | IPEAK | | |
|---|---|---|---|---|---|---|---|
| VBST < 2.0 | STATE 1 | SW1 | LOW | CS1 | 40mA | 301 | TH1 = 2.0 V |
| 2.0 < VBST < 2.3 | STATE 1 | SW1 | HIGH | CS2 | 80mA | 302 | TH2 = 2.3 V |
| | STATE 2 | SW2 | LOW | CS2 | 80mA | | |
| 2.3 < VBST < 2.6 | STATE 2 | SW2 | HIGH | CS3 | 160mA | 303 | TH3 = 2.6 V |
| | STATE 3 | SW3 | LOW | CS3 | 160mA | | |
| 2.6 < VBST < 3.0 | STATE 3 | SW3 | HIGH | CS4 | 320mA | 304 | TH4 = 3.0 V |
| | STATE 4 | SW4 | LOW | CS4 | 320mA | | |
| VBST > 3.0 | STATE 4 | SW4 | HIGH | CS5 | 500mA | 305 | |

MULTI-LEVEL VOLTAGE DETECTOR

CROSS-REFERENCE TO RELATED APPLICATION

Under 35 U.S.C. § 119, this application is divisional of U.S. patent application Ser. No. 16/729,339, filed Dec. 28, 2019, which claims priority to, and the benefit of, U.S. Provisional Patent Application No. 62/809,071, filed Feb. 22, 2019, all of which are incorporated herein by reference in their entirety.

BACKGROUND

Voltage detector circuits are used in a variety of applications to track variations in a voltage signal. Voltage tracking may be used for feedback adjustment of a DC to DC converter or in other applications where a multi-level signal is generated to represent or track the amplitude of a voltage signal. Choosing from different types of a multi-level voltage detectors involves trade-offs among speed, accuracy, size and complexity. One type of multi-level voltage detector uses a flash analog to digital converter (ADC) with multiple comparators and a resistor divider circuit. Flash ADC designs occupy large amounts of die and/or circuit board area and consume high amounts of power. In addition, flash ADC approaches suffer from mismatch among input offsets of all comparators, particularly for small voltage level spacing. Moreover, the complexity and area of coding logic increases significantly as the number of comparators increases. Although flash ADC voltage detectors can provide a converted value in a single clock cycle, this form of voltage detector suffers from increased parasitic load capacitance with increasing numbers of comparators, which limits the speed of operation. Another type of multi-level voltage detector uses a successive approximation register (SAR) ADC with a single comparator operated according to a slow binary search algorithm. SAR ADC designs consume less power and occupy less space than flash ADC designs. In addition, SAR ADC voltage converters do not suffer from comparator mismatch problems associated with flash ADC designs. However, the binary search algorithm used in SAR ADCs yields only a single bit in each converter clock cycle, and a sample-and-hold circuit may be needed, which increases the power and area.

SUMMARY

In one aspect, a voltage detector comprises a resistor divider circuit having N intermediate nodes that join adjacent pairs of divider resistors, a switching circuit having N switches coupled to the respective intermediate nodes, as well as a comparator with an input coupled to the switches, and a state machine with having an input coupled to the output of the comparator, and a decoder having N decoder outputs coupled to respective control terminals of the N switches.

The state machine in one example has a current state with one of N possible state values in each cycle of a clock signal. The decoder in one example is configured to activate only one of the decoder outputs to turn a single corresponding one of the switches on according to the current state in each cycle of the clock signal. In one example, the state machine is configured to selectively update the current state to a next state value responsive to the clock signal and responsive to a comparator output signal at the output of the comparator. In one example, the state machine is configured to set the next state value to the current state value or to an intermediate state value that is adjacent to the current state value according to the comparator output signal for the current state having a first state value or an $N^{th}$ state value. For the current state having an intermediate state value, the state machine is configured to set the next state value to one of two adjacent state values according to the comparator output signal.

In one example, the state machine includes a second decoder having N+1 second decoder outputs, and the second decoder is configured to activate only one of the second decoder outputs at a time. The second decoder is configured to activate one of the second decoder outputs in each cycle of the clock signal according to the current state and the next state of the state machine. For the current and next states having the first state value, the second decoder is configured to activate a first one of the second decoder outputs. For the current state and next state having the $N^{th}$ state value and the next state value having the $N^{th}$ state value, the second decoder is configured to activate an $N+1^{th}$ one of the second decoder outputs. For the current state having an $i^{th}$ state value and the next state value having the $i+1^{th}$ state value, the second decoder is configured to activate the $i+1^{th}$ one of the second decoder outputs. For the current state having the $i+1^{th}$ state value and the next state value having the $i^{th}$ state value, the second decoder is configured to activate the $i^{th}$ one of the second decoder outputs.

In another aspect, a method includes coupling a single one of an integer number N intermediate nodes of a resistor divider circuit to an input of a comparator according to a current state of a state machine having one of N possible state values in each cycle of a clock signal. The method further includes selectively updating the state value of the current state to a next state value responsive to the clock signal and responsive to a comparator output signal at an output of the comparator, and activating a single one of N+1 decoder outputs in a given cycle of the clock signal according to the state value of the current state and the next state value. In one example, the method further includes adjusting an operating condition of a power converter according to the decoder outputs.

In one example, the updating of the state value of the current state to the next state value includes setting the next state value to the current state value or to an intermediate state value that is adjacent to the current state value according to the comparator output signal for the current state having the first state value or the $N^{th}$ state value. For the current state having an intermediate state value, updating the state value includes setting the next state value to one of two adjacent state values according to the comparator output signal.

In one example, activating the single one of N+1 decoder outputs in a given cycle of the clock signal includes activating the first output for the current state and the next state having the first state value, and activating the $N+1^{th}$ one of the second decoder outputs for the current and next states having the $N^{th}$ state value. For the current state having an $i^{th}$ state value and the next state value having an $i+1^{th}$ state value, the method includes activating an $i+1^{th}$ one of the second decoder outputs, and for the current state having the $i+1^{th}$ state value and the next state value having the $i^{th}$ state value, activating an $i^{th}$ one of the second decoder outputs.

In a further aspect, a power converter includes an inductor coupled to a switching node, a switch having a terminal coupled to the switching node and a control input, a current sensor coupled to the switching node, and a current reference circuit having an integer number N+1 current reference inputs, and a current reference output. The power converter further includes a converter comparator having a first input coupled to the current sensor, a second input (618) coupled to the output of the current reference circuit, and an output, as well as a controller and a voltage detector. The controller has an input coupled to the output of the converter comparator, and an output coupled to the control input of the switch. The voltage detector includes a voltage detector input coupled to the converter output, a state machine having a state with N possible state values, and N+1 decoder outputs coupled to the respective ones of the N+1 current reference inputs.

In one example, the voltage detector includes a resistor divider circuit, a switching circuit having N switches coupled to respective intermediate nodes of the resistor divider, as well as a second terminal, and a control terminal. The voltage detector further includes a comparator having a first input coupled to a voltage reference, a second input coupled to the switches, and an output. The state machine has an input coupled to the output of the comparator, a first decoder having N first decoder outputs coupled to respective control terminals of the switches, and a second decoder having the N+1 decoder outputs coupled to the respective ones of the N+1 current reference inputs.

In one example, the state machine has a current state with one of N possible state values in each cycle of a clock signal, and the first decoder is configured to activate only a single one of the first decoder outputs to turn a single corresponding one of the switches on according to the current state in each cycle of the clock signal. The first decoder is configured to activate an $i^{th}$ one of the decoder outputs in a given cycle of the clock signal for which the current state is an $i^{th}$ one of the N possible state values, and the state machine is configured to selectively update the current state to a next state value responsive to the clock signal and responsive to a comparator output signal at the output of the comparator. In one example, the state machine is configured to set the next state value to the current state value or to an adjacent intermediate state value for the current state having the first state value or the $N^{th}$ state value, and for the current state having an intermediate state value, the state machine is configured to set the next state value to one of two adjacent state values that are adjacent to the current state value according to the comparator output signal.

In one example, the second decoder is configured to activate only a single one of the decoder outputs at a time. In one example, for the current state and the next state having a first state value, the second decoder is configured to activate a first one of the decoder outputs. For the current state and the next state having the $N^{th}$ state value, the second decoder is configured to activate an N+1$^{th}$ one of the decoder outputs. For the current state having an $i^{th}$ state value and the next state value having the i+1$^{th}$ state value, the second decoder is configured to activate an i+1$^{th}$ one of the decoder outputs, and for the current state having the i+1$^{th}$ state value and the next state value having the $i^{th}$ state value, the second decoder is configured to activate an $i^{th}$ one of the decoder outputs.

DETAILED DESCRIPTION

Figure 1:
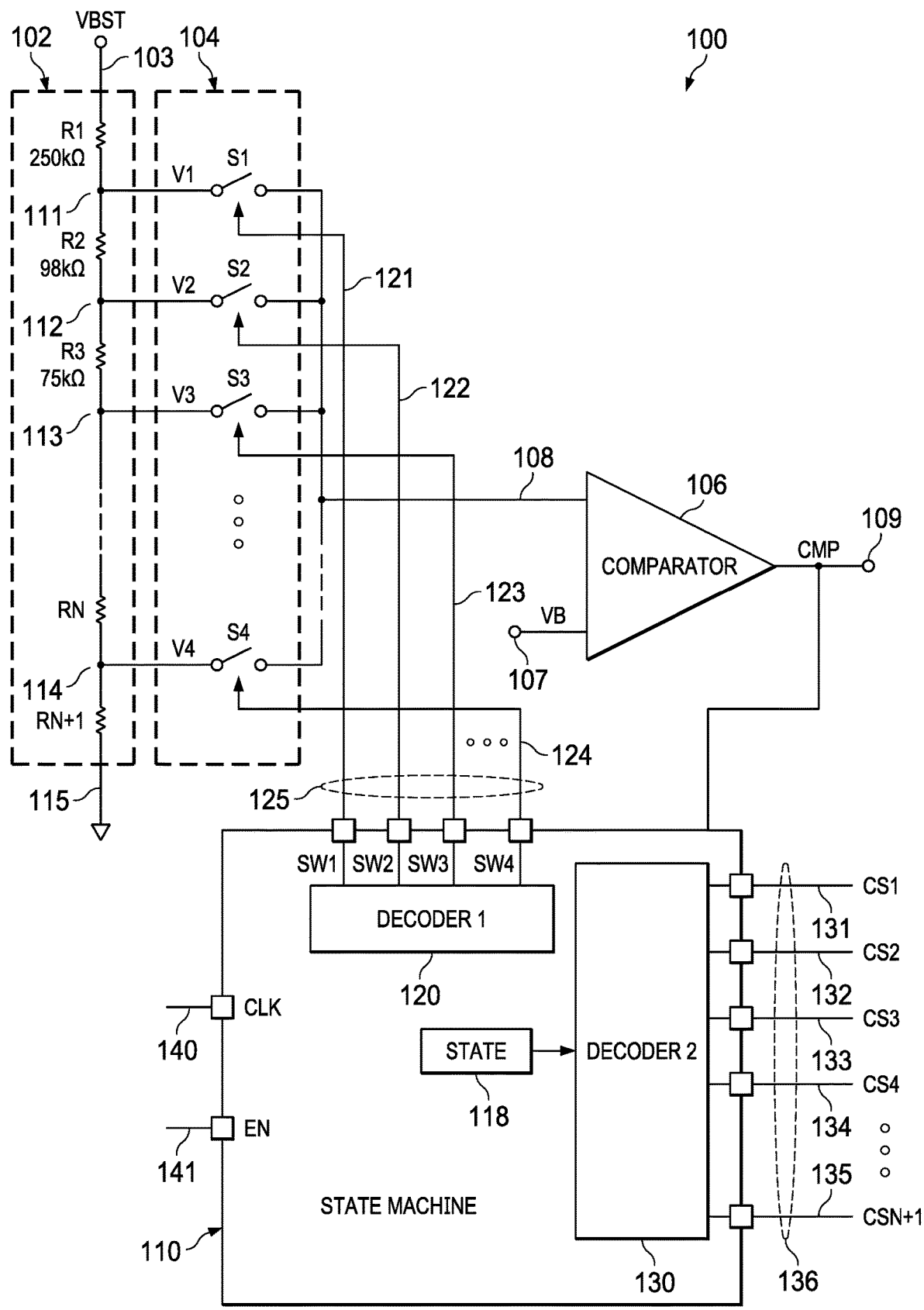
FIG. 1 is a schematic diagram of a voltage detector with an N-state state machine, an N-bit first decoder to control connection of resistive divider nodes to a comparator, and an N+1 bit second decoder.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Referring initially to FIGS. 1-4, an example multi-level voltage detector 100 is illustrated and described below with a state machine having an integer number N states, a resistive divider circuit, and a single comparator, where N is greater than 2. The state machine has N+1 decoder outputs that provide a converted value or representation of a tracked voltage in each cycle of a clock signal. Unlike SAR ADC designs, the voltage detector 100 provides fast voltage tracking without adding excessive parasitic load capacitance. In addition, the single comparator voltage detector 100 provides a compact low complexity solution with lower circuit area and improved power efficiency, and no mismatch problems compared with flash ADC designs.

FIG. 1 shows an example of the voltage detector 100 with a resistive divider circuit 102 coupled to an input 103, a switching circuit 104, and a single comparator 106 with respective first and second inputs 107 and 108, and an output 109. The voltage detector 100 also includes a state machine 110. The resistive divider circuit 102 has an integer number N+1 resistors R1, R2, R3, . . . , RN, and RN+1 coupled in series with one another between an input 103 and a reference node. The example voltage detector 100 is described below in the context of a 4-state state machine 110, where N=4. In other examples, N is any integer greater than 2. The resistor divider circuit 102 includes N=4 intermediate nodes 111, 112, 113, and 114, in which respective ones of the intermediate nodes 111, 112, 113, and 114 join adjacent pairs of the resistors R1, R2, R3, . . . RN, and RN+1. In this example, the first intermediate node 111 joins the resistors R1 and R2, the second intermediate node 112 joins the adjacent resistors R2 and R3, the third intermediate node 113 joins the resistors R3 and RN, and the fourth intermediate node 114 joins the resistors RN and RN+1. The series-connected resistors R1, R2, R3, . . . RN, and RN+1 are connected in series with one another between the input 103 and a reference node 115 (e.g., a ground reference or other reference voltage node). The resistive divider circuit 102 provides a voltage divider circuit with intermediate node voltages V1, V2, V3, and V4 at the respective intermediate nodes 111, 112, 113, and 114.

The switching circuit 104 includes N switches S1, S2, S3, and S4, each having a first terminal coupled to a respective one of the intermediate nodes 111, 112, 113, 114. The switches S1, S2, S3, and S4 each have a second terminal coupled to the second input 108 of the comparator 106. Each of the switches S1, S2, S3, and S4 also have a control terminal. Any suitable switches can be used, such as transistors. The voltage detector 100 in one example tracks a boost converter voltage VBST of a power converter circuit, as described further below in connection with FIG. 6. In one example, the state machine 110 provides an N+1 bit decoder with outputs that represent the amplitude of the boost converter voltage VBST relative to a voltage of the reference node 115. In the illustrated example, the first input 107 of the comparator 106 is connected to a reference voltage VB, and the comparator output 109 provides a comparator output signal CMP having one of two possible states or ranges (e.g., "1" or "0") depending on whether the voltage V1, V2, V3, or V4 connected to the second comparator input 108 is greater than or less than the reference voltage VB.

The resistors R1, R2, R3, . . . RN, and RN+1 in FIG. 1 have respective values 250 kΩ, 98 kΩ, 75 kΩ, 77 kΩ and 500 kΩ, and the reference voltage VB=1.5 V to track a boost voltage VB ST in a range of 0-3.6 V with threshold voltages associated with the different switching circuit states of approximately 2.0, 2.3, 2.6, and 3.0 V. In other examples, other resistor values and reference voltage values are used. In the illustrated implementation, the voltage detector 100 tracks the voltage VBST at the input 103 relative to the voltage of the reference node 115. In another example, a constant reference voltage is connected to the input 103, and the voltage detector 100 tracks the voltage at the first comparator input 107.

Unlike flash ADC voltage detector approaches, the voltage detector 100 in FIG. 1 uses only a single comparator 106. Moreover, unlike successive approximation register converters, the voltage detector 100 does not use slow binary search algorithms, and instead uses an N=4 state state machine 110 with a novel fast search algorithm that provides a converted state or decoder output that characterizes the tract voltage VB ST in each cycle of a clock signal.

The state machine 110 includes an input coupled to the output 109 of the comparator 106. In addition, the state machine 110 has a current state 118 with one of N possible state values in each cycle of a clock signal CLK. In one example, the state machine 110 includes a register that stores a state value of the current state 118. The state machine 110 also includes a first decoder 120 with N decoder outputs 121, 122, 123, and 124 coupled to the respective control terminals of the N switches S1, S2, S3, and S4. The collective decoder outputs 121, 122, 123, and 124 form an N-bit decoder output 125. The first decoder 120 is configured to activate only a single one of the decoder outputs 121, 122, 123, or 124 to turn a single corresponding one of the switches S1, S2, S3, or S4 on according to the current state 118 in each cycle of a clock signal CLK.

In the illustrated implementation, the first decoder 120 provides switching control signals SW1, SW2, SW3 and SW4 at the respective decoder outputs 121, 122, 123, and 124 with suitable voltages such that only one of the corresponding switches S1, S2, S3 or S4 is activated (i.e., turned on) at a time. In one implementation, the switches S1, S2, S3 or S4 are n-channel field effect transistors (FETs), and the first decoder 120 provides a single one of the switching control signals SW1, SW2, SW3 and SW4 in a high active state to turn on the respective one of the switches S1, S2, S3 or S4, while the other switching control signals remain low. The N-bit first decoder 120 controls connection of resistive divider nodes 111, 112, 113 or 114 to the input 108 of the comparator 106.

The state machine 110 also includes a second decoder 130 having an N+1 bit decoder output 136 with 5 second decoder outputs 131, 132, 133, 134, and 135. In one example, the second decoder output 136 is coupled to a peak current select circuit in a boost converter (e.g., FIG. 6 below), and the second decoder 130 provides respective current select second decoder output signals CS1, CS2, CS3, CS4, and CS5 at the respective second decoder outputs 131, 132, 133, 134, and 135. In this example, the second decoder 130 provides a single one of the switching control signals CS1, CS2, CS3, CS4, and CS5 in a high active state while the other switching control signals remain low. The voltage detector 100 has a clock input 140 configured or otherwise adapted to receive a clock signal CLK, and an enable input 141 adapted to receive an enable signal EN.

Figures 2, 3:
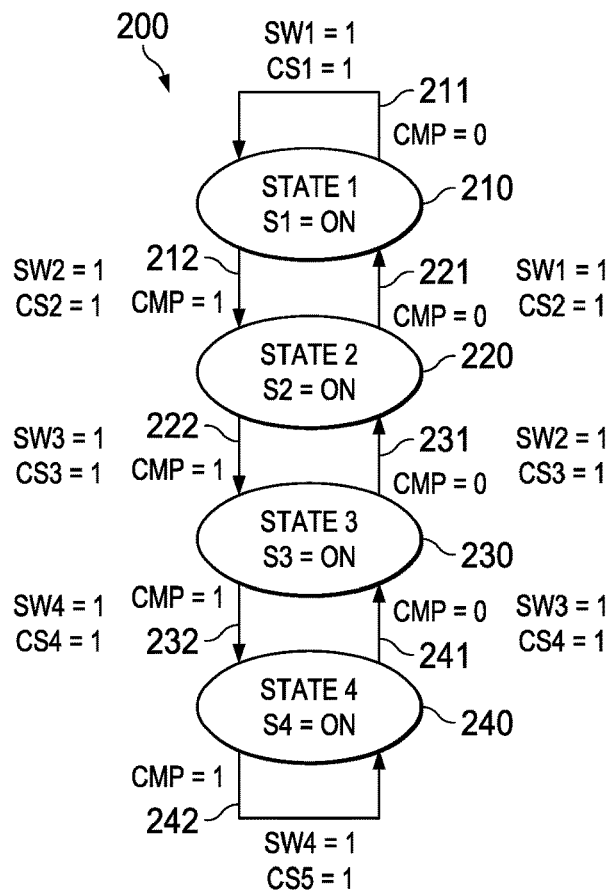
FIG. 2 is a state diagram for an example of the state machine of FIG. 1 with N=4.
FIG. 3 is a state table for an example of the voltage detector of FIG. 1 with N=4.

FIG. 2 shows a state diagram 200 for the state machine 110 of FIG. 1 with N=4 states. The state machine 110 is configured to maintain and selectively update the current state 118 with one of N possible state values 210, 220, 230, and 240 in each cycle of the clock signal CLK at the clock input 140. The possible state values include a first state value 210 (STATE 1), N−2 intermediate state values 220 (STATE 2) and 230 STATE 3), and a final or N$^{th}$ state value 240 (STATE 4). The state machine 110 maintains and updates the current state 118 (FIG. 1) with one of the N=4 possible state values 210, 220, 230, or 240 in each cycle of the clock signal CLK at the clock input 140.

The first decoder 120 in FIG. 1 is configured to activate an i$^{th}$ one of the decoder outputs 121, 122, 123, or 124 in a given cycle of the clock signal CLK for which the current state 118 is an i$^{th}$ one of the N respective possible state values 210, 220, 230, or 240. The state machine 110 is configured to selectively update the current state 118 to a next state value 210, 220, 230, or 240 responsive to the clock signal CLK and responsive to the comparator output signal CMP at the output 109 of the comparator 106.

The state diagram 200 in FIG. 2 illustrates the state updating by the state machine 110. In operation in one example, the state machine 110 starts at the first state value 210 (STATE 1) in response to an active signal EN at the enable input 141. In operation, when the current state 118 has the first state value 210 or the N$^{th}$ (e.g., 4$^{th}$) state value 240, the state machine 110 is configured to set the next state value to the current state value (e.g., no change) in response to the comparator output signal having the same value as in a previous cycle of the clock signal CLK. As shown in FIG. 2, when the current state is the first state 210, and the comparator output signal CMP=0, the state diagram transitions along a path 211 back to the first state 210 (the first switch S1 is ON). The first switching control signal SW1=1, and the second decoder provides the first decoder signal CS1=1 (active). Otherwise, if the comparator output signal CMP=1, the converter boost voltage VBST has transitioned through a first threshold (discussed further below), and the state machine 110 sets the next state value to the adjacent intermediate state value 220.

As used herein, adjacent states are sequentially adjacent in that the first and second states 210 and 220 are adjacent to one another, the first and third states 210 and 230 are adjacent to the second state 220, the second and fourth states 220 and 240 are adjacent to the third state 230, and the third and fourth states 230 and 240 are adjacent to one another. In the example of FIG. 2, the state diagram 200 transitions along a path 212 from the first state 210 to the second state 220 in response to the comparator output signal CMP=1. This indicates that the converted boost voltage V BST has transitioned through a first threshold (e.g., FIG. 7 below). The state machine activates the second switching control signal SW2=1 to turn on the second switch S2 in the second state 220, and the second decoder output activates the second decoder output (e.g., current select) signal CS2=1.

When the current state has one of the intermediate state values 220 or 230, the state machine 110 is configured to set the next state value to one of two of the state values that are adjacent to the current state value according to the comparator output signal CMP. Continuing with the example in FIG. 2, when the state machine 110 is currently in the second state 220, the next state value will be either the first state 210 or the third state 230 (e.g., the state machine does not remain in any of the intermediate states 220 or 230 in two consecutive cycles of the clock signal CLK). In this example, if the comparator output signal CMP=0 (indicating that the converted boost voltage VBST has not transitioned through a second threshold), the state machine 110 transitions along a first path 221 to set the next state to the first state 210. For the transition along the path 221, the state machine again turns the first switch S1 to the on state by the first decoder 120 setting the first switching control signal SW1=1. In this example, moreover, the second decoder 130 again activates its second output by setting the second current select signal CS2=1. In this manner, the second decoder 130 maintains the current select signaling in its second state while the state machine transitions back and forth between the first and second states 210 and 220.

Continuing in the example of FIG. 2, when the current state is the second state 220, and the comparator output signal CMP=1, the state diagram 200 transitions along a second path 222 from the second state 220 to the third state 230. This comparator output condition indicates that the converted boost voltage VBST has transitioned through a second threshold. In response, the first decoder 120 activates its third switching control signal SW3=1 to turn the third switch S3 ON. In addition, the second decoder 130 activates its third output to set the third current select signal CS3=1.

When the current state is the third state 230, the state machine 110 selectively transitions to one of its adjacent states 220 or 240 according to the comparator output signal CMP. If the comparator output signal CMP=0 (indicating that the converted boost voltage VBST has not transitioned through another threshold), the state diagram 200 transitions along the first path 231 back to the second state 220. In this case, the first decoder 120 again activates its second output to set the second switching control signal SW2=1 to again turn the second switch S2 on, and the second decoder 130 again activates its third output to set the third current select signal CS3=1. If instead the comparator output signal CMP=1 (indicating that the converted boost voltage VB ST has transitioned above a four threshold), the state diagram 200 transitions along a second path 232 from the third state 230 to the fourth state 240. In this transition along path 232, the first decoder 120 activates its fourth output 124 to set the fourth switching control signal SW4=1, and the second decoder 130 activates its fourth output to set the fourth current select signal CS4=1.

When the current state is the fourth state 240, the state machine 110 is configured to set the next state value to the current state value 240 (along transition path 242) in response to the comparator output signal having the same value (CMP=1) as in the previous cycle of the clock signal CLK, or to transition along a path 241 to transition to the adjacent third state 234 a change in the comparator output signal CMP=0, indicating the converted boost voltage VBST has transitioned below the four threshold. In the first case (CMP=1), the first decoder 120 again activates its fourth output 124 to set the fourth switching control signal SW4=1, and the second decoder 130 activates its fourth output to set the fourth current select signal CS4=1. In the latter case (CMP=0), the first decoder 120 activates its third switching control signal SW3=1 to turn the third switch S3 ON, and the second decoder 130 activates its third output to set the third current select signal CS3=1.

As shown in the example state diagram 200 of FIG. 2, the second decoder 130 is configured to activate one of the second decoder outputs 131, 132, 133, 134, or 135 in a given cycle of the clock signal CLK according to a state value of the current state 118 and the next state value. For the current state 118 having the first state value 210 and the next state value having the first state value 210, the second decoder 130 is configured to activate the decoder output 131, and for the current state 118 having the $N^{th}$ state value 240 and the next state value having the $N^{th}$ state value 240, the second decoder 130 is configured to activate the $N+1^{th}$ one of the second decoder outputs 135. For the current state 118 having an $i^{th}$ state value 210, 220, 230 and the next state value having the $i+1^{th}$ state value 220, 230, 240, the second decoder 130 is configured to activate an i+1 t h one of the second decoder outputs 132, 133, 134, 135. In addition, for the current state 118 having the $i+1^{th}$ state value 210, 220, 230 and the next state value having the $i^{th}$ state value 220, 230, 240, the second decoder 130 is configured to activate the $i^{th}$ one of the second decoder outputs 132, 133, 134, 135. In all instances, the second decoder 130 is configured to activate only a single one of the second decoder outputs 131, 132, 133, 134, 135 at a time.

FIG. 3 shows state table for the state machine 110 in the voltage detector 100 of FIG. 1, which further illustrates the operation shown in the state diagram 200 of FIG. 2. The state table 300 includes a first row in which the converted boost voltage VBST is less than a first threshold TH1=2.0 V, corresponding to a first state 301 of N+1 states of the second decoder 130 (e.g., 5 different current select states). A second current select state 302 includes two rows of the table 300 that correspond to transitions back and forth between the first and second states 210 and 220 of the state machine 110. The second current select state 302 corresponds to a converted boost voltage signal VBST between the first threshold TH1, and a second threshold TH2=2.3 V (e.g., 2.0<VBST<2.3). A third current select state 303 includes the subsequent two rows of the table 300 that correspond to the state machine 110 transitioning back and forth between the second and third states 220 and 230. The third current select state 303 in FIG. 3 includes two rows of the table 300 that correspond to the state machine 110 transitioning back and forth between the second and third states 220 and 230. The third current select state 303 corresponds to a converted boost voltage signal VB ST between the second threshold TH2, and a third threshold TH3=2.6 V (e.g., 2.3<VBST<2.6).

A fourth current select state 304 includes two rows of the table 300 that correspond to the state machine 110 transitioning back and forth between the third and fourth states 230 and 240. The fourth current select state 304 corresponds to a converted boost voltage signal VBST between the third threshold TH3 and a fourth threshold TH4=3.0 V (e.g., 2.6<VBST<3.0). A fifth current select state 305 includes the final row of the table 300 that corresponds to the state machine 110 remaining in the fourth state 240 with VBST remaining above the fourth threshold TH4 (e.g. VBST>3.0 V).

The state table 300 includes a first column 311 showing the voltage ranges of the converted boost voltage signal VBST, a second column 312 that indicates the corresponding state of the state machine 110, and a third column 313 that shows the corresponding first decoder active output signal (e.g., switching control signal). A fourth column 314 shows the corresponding role values of the comparator output signal CMP (e.g., LOW corresponds to a "0" state as discussed above, and HIGH corresponds to a "1" state). A fifth column 315 shows the active output signal of the second decoder 130 (e.g., active current select signal), and a sixth column 316 indicates a corresponding peak current value selected as a result of the second decoder output in an example boost converter discussed below in connection with FIG. 6.

Figure 4:
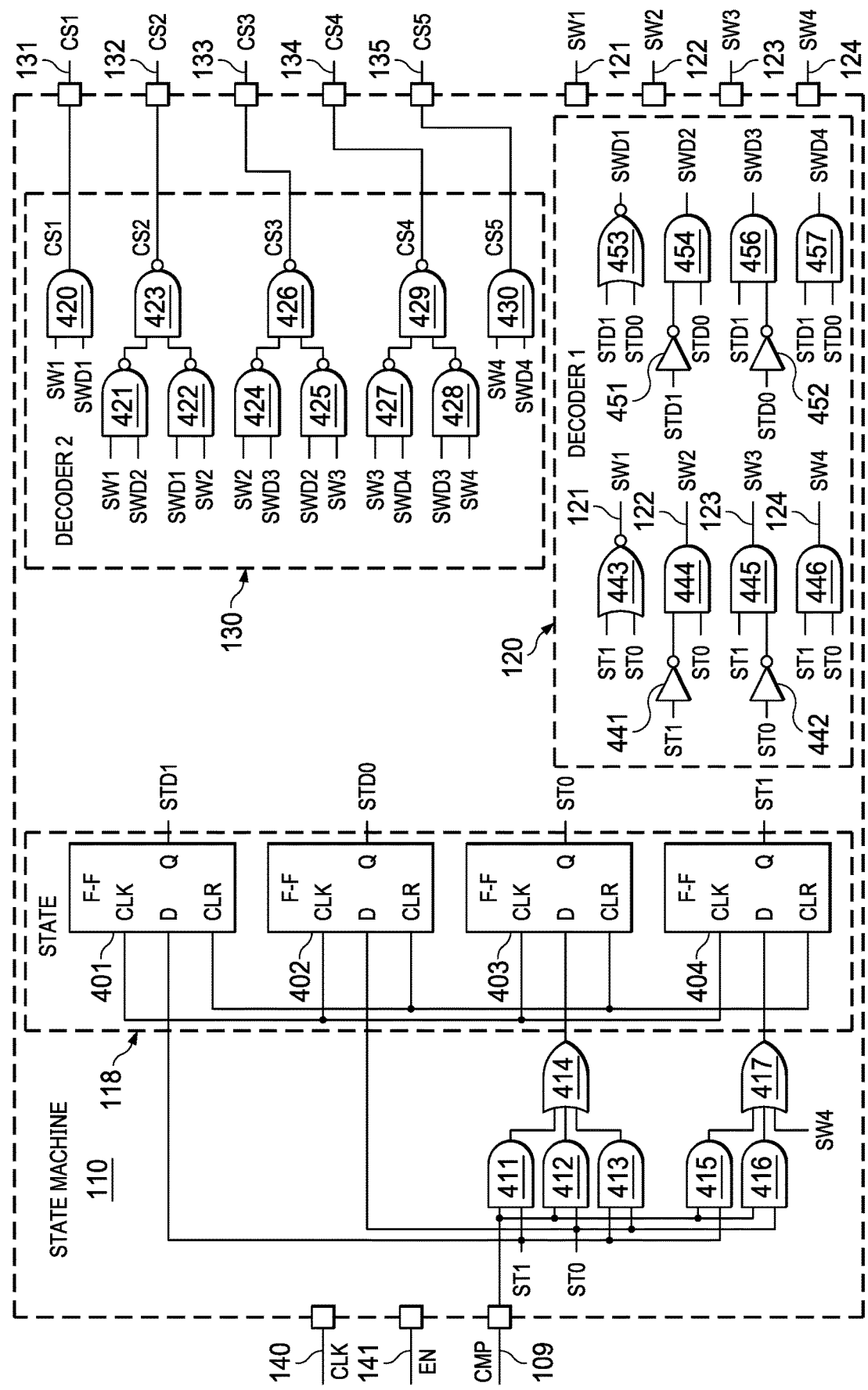
FIG. 4 is a schematic diagram of one example of the state machine of FIG. 1.

FIG. 4 shows one example circuit implementation of the state machine 110 of FIG. 1. The state machine 110 includes a register or set of D flip flops 401, 402, 403 and 404 that store and maintain the state 118 as respective state output signals STD1, STD0, ST0 and ST1. The flip flop 401-404 have clock inputs coupled to the clock input 140 of the state machine 110, as well as clear inputs coupled with the enable input 141 of the state machine 110. The comparator output 109 is coupled to a logic circuit formed by 2-input AND gates 411, 412, 413, 415, and 416, as well as 3-input OR gates 414 and 417. The OR gates 414 and 417 of the logic circuit 411-417 provide data input signals to the respective data inputs of the flip flops 403 and 404 according to the comparator output signal CMP and current and next state signals ST0 and ST1. The first decoder 120 receives the state output signals STD1, STD0, ST0, and ST1 from the current state 118, and provides the switching control signals SW1, SW2, SW3, and SW4 at the first decoder outputs 121, 122, 123, and 124, respectively. The first decoder 120 also provides inverse switching signals SWD1, SWD2, SWD3, and SWD4 to the second decoder 130.

The second decoder 130 receives the state output signals STD1, STD0, ST0 and ST1, as well as the inverse switching signals SWD1, SWD2, SWD3, and SWD4, and generates the current select signals CS1, CS2, CS3, CS4, and CS5 at the respective second decoder outputs 131, 132, 133, 134, and 135. The second decoder 130 includes an AND gate 420, NAND gates 421, 422, 423, 424, 425, 426, 427, 428, and 429, and another AND gate 430 interconnected as shown in FIG. 4. The NAND gates 420, 423, 426, 429, and 430 have outputs coupled to the respective provide the respective second decoder outputs 131, 132, 133, 134, and 135. The first decoder 120 includes a first circuit having inverters 441 and 442, as well as a 2-input NOR gate 443 and AND gates 444, 445, and 446 that generate the switching control signals SW1, SW2, SW3, and SW4 at the respective first decoder outputs 121, 122, 123, and 124 according to the ST0 and ST1 state output signals. A second circuit of the first decoder 120 includes inverters 451 and 452, a 2-input NOR gate 453 and AND gates 454, 455, and 456 that generate the switching control signals SW1, SW2, SW3, and SW4 at the respective first decoder outputs 121, 122, 123, and 124 according to the state output signals STD0 and STD1.

The voltage detector 100 achieves fast voltage tracking with a N+1 level second decoder output 136 that allows peak current selection from 5 different peak current values for adjusting a power converter circuit in one application, described further below in connection with FIG. 6. The voltage detector 100 provides fast conversion or tracking in a single clock signal cycle and uses less power and circuit board/die area, without comparator offset mismatch effects. In one possible application, VB is a reference voltage, and VBST is a varying input voltage for detection. In another possible application, VBST is a fixed reference voltage, and VB is a varying input voltage for detection. In another possible application, VBST and VB are both varying voltages, and the voltage detector 100 converts a value for the voltage-ratio of VB/VBST. The low complexity fast-tracking search algorithm of the state machine 110 facilitates fast operation with a single comparator 106 compared to binary search approaches of successive approximation register voltage detectors, and without requiring any sample and hold circuits.

Figure 5:
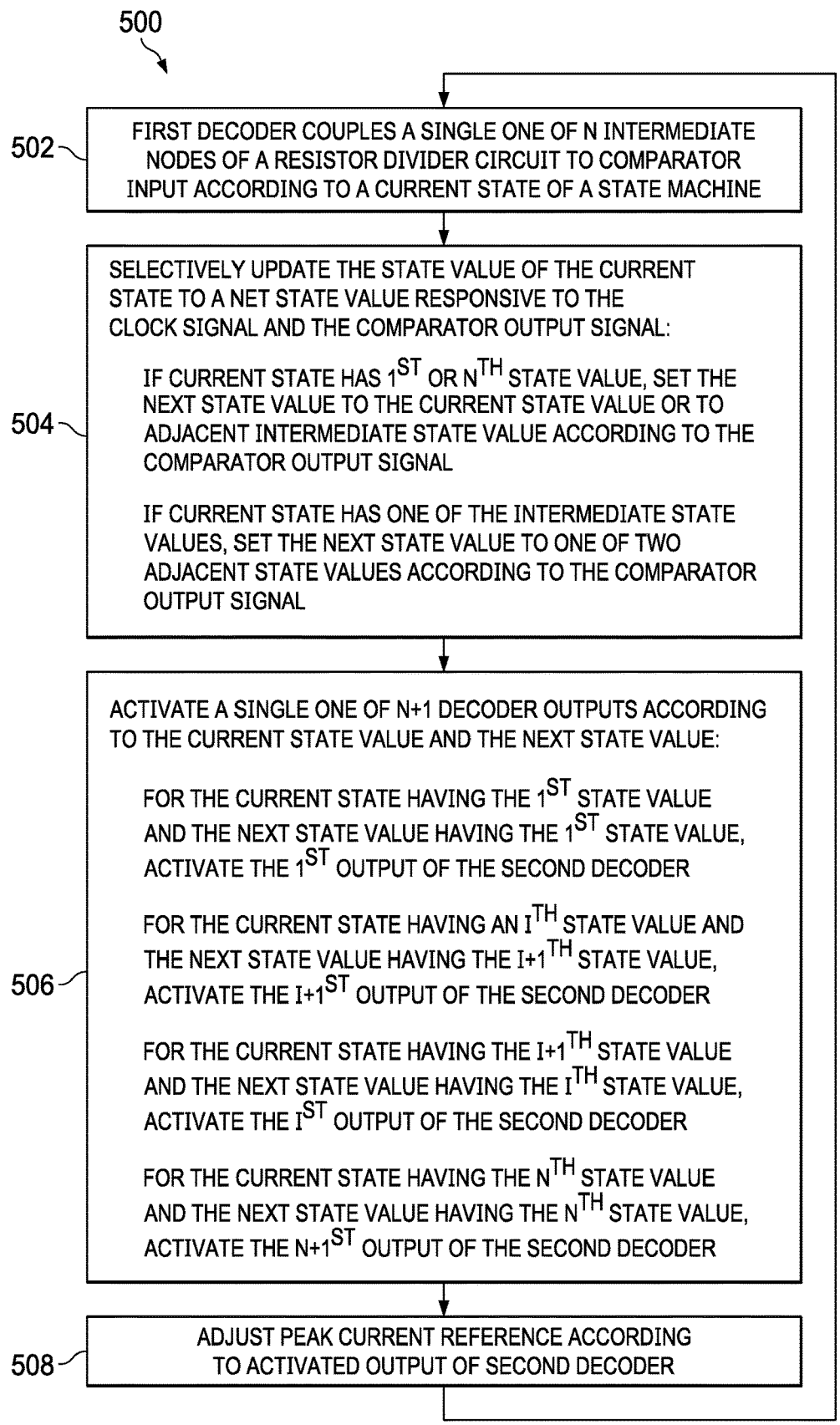
FIG. 5 is a flow diagram of a method of adjusting a boost power converter peak current reference.

Referring also to FIG. 5, a method 500 is described for adjusting a peak current reference of a power converter. The method 500 includes coupling a single one of an integer number N intermediate nodes 111, 112, 113, 114 of the resistor divider circuit 102 to the input 108 of the comparator 106 at 502 according to the current state 118 of the state machine 110. In the above example, the current state 118 in one implementation has one of N possible state values 210, 220, 230, 240 in each cycle of the clock signal CLK.

At 504, the method 500 continues with selectively updating the state value of the current state 118 to a next state value in response to the clock signal CLK and the comparator output signal CMP. The state value is used in one example to generate the switching control signals SW1-SW4 to connect one of the resistive divider circuit intermediate nodes with the comparator 106 in FIG. 1. In one example, the state updating at 504 includes, if the current state 118 has the first state value 210 or the $N^{th}$ state value 240, setting the next state value to the current state value or to an adjacent intermediate state value according to the comparator output signal CMP; and if the current state 118 has one of the intermediate state values 220 or 230, setting the next state value to one of two adjacent state values according to the comparator output signal CMP.

The method 500 continues at 506, with activating a single one of the N+1 second decoder outputs (e.g., 131, 132, 133, 134, or 135) in a given cycle of the clock signal CLK according to the current and next state values. In one example, the decoder output activation at 506 includes: for the current state 118 having the first state value 210 and the next state value having the first state value 210, activating a first one of the second decoder outputs (e.g., output 131), and for the current state 118 and the next state having the $N^{th}$ state value 240, activating an $N+1^{th}$ one of the second decoder outputs (135). In this example, the decoder output activation at 506 also includes: for the current state 118 having an $i^{th}$ state value and the next state value having an $i+1^{th}$ state value, activating the $i+1^{th}$ one of the second decoder outputs; and for the current state 118 having the $i+1^{th}$ state value and the next state value having the $i^{th}$ state value, activating the $i^{th}$ one of the second decoder outputs. In one implementation, the method 500 continues at 508, with adjusting an operating condition (e.g., a peak inductor current IPEAK) of a power converter according to the activated output 131, 132, 133, 134, or 135 of the second decoder 130. In another implementation, the second decoder output is used for another purpose.

Figure 6:
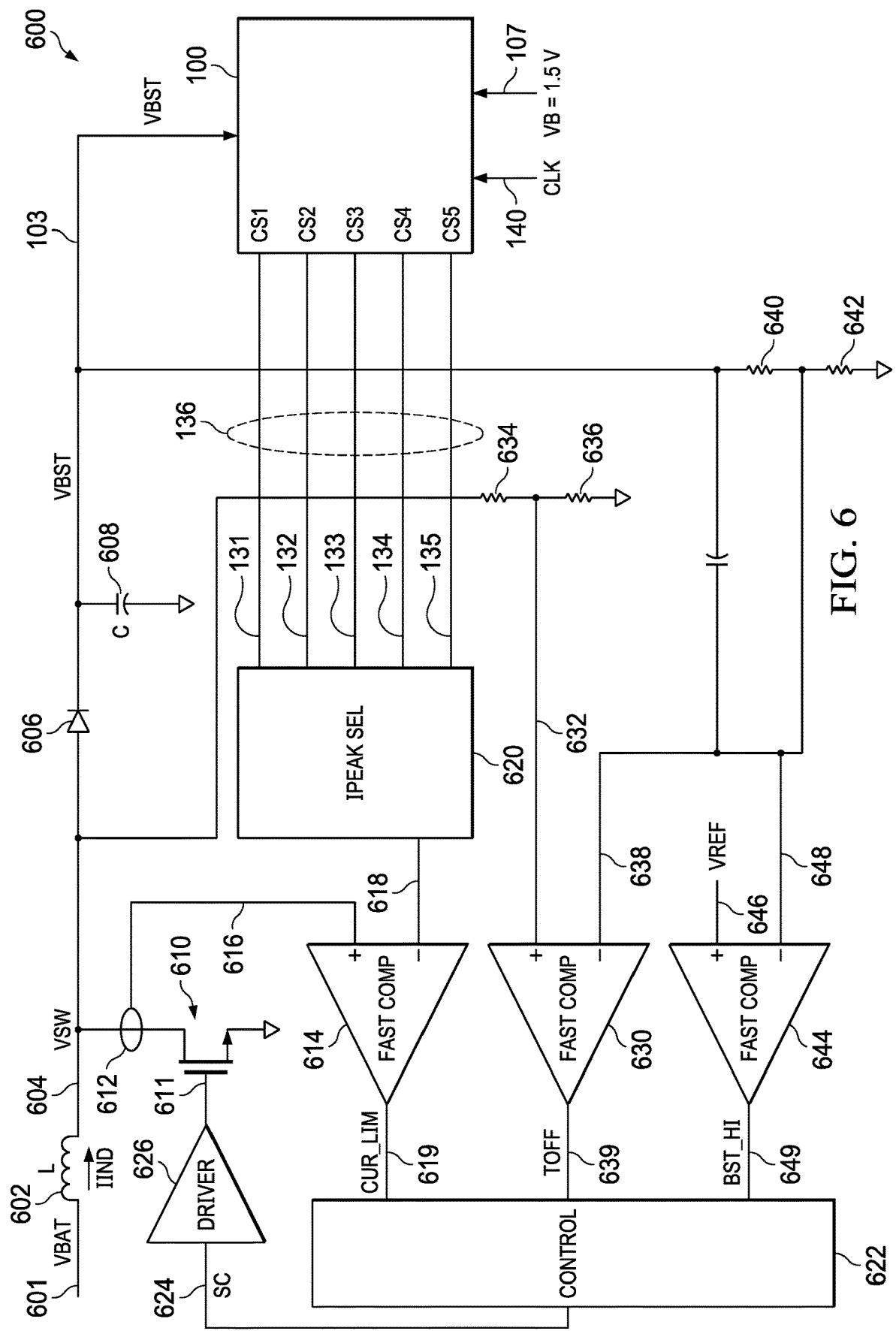
FIG. 6 is a schematic diagram of a DC to DC boost power converter with the voltage detector of FIG. 1 to adjust a peak current reference.

FIG. 6 shows an example hysteretic boost DC to DC power converter 600 with the fast track voltage detector 100 of FIG. 1 to adjust a peak current reference. In one implementation, the boost converter 600 is configured to provide a regulated DC voltage VBST that ranges from 0 to 3.6 V, and the reference voltage VB is 1.5 V. In the illustrated implementation, the clock signal CL K provided to the voltage detector clock input 140 is, or is derived from, a low side switch turn off signal TOFF to allow the voltage detector 100 to autonomously adjust and inductor peak current during a settling period of the hysteretic boost type power converter 600. The boost power converter 600 includes a converter input 601 adapted to be connected to an input source (e.g., a battery, not shown) to receive a DC input voltage signal VBAT. The power converter 600 further includes an inductor 602 with an inductance L. The inductor 602 is coupled between the input 601 and a switching node 604 with a switch node voltage VSW. The power converter 600 also includes an output that delivers a boosted output voltage signal VBST. The converter output is connected to the voltage detector input 103 in a voltage feedback loop that selectively adjusts a peak current of the inductor 602. A diode 606 has an anode connected to the switch node 604 and a cathode connected to the converter output. An output capacitor 608 having a capacitance C is connected between the converter output and a reference node. In another implementation, the diode 606 is replaced with a transistor or other switch (not shown).

The power converter 600 includes a switch 610 (e.g., an n-channel FET) having a first terminal (e.g., a drain) coupled to the switching node 604, a second terminal (e.g., a source) connected to a reference node, and a control input 611 (e.g., a gate terminal). The switch 610 is operated according to a gate control signal to control connection of the switch node 604 to the reference node, and hence to control a current IIND through the inductor 602. The switch 610 operates as a low side switch in a boost converter configuration of the example in FIG. 6. In other configurations, the switch 610 is configured as a low side or high side switch in a different converter topology, such as buck converter, buck-boost converter, cuk converter, flyback converter, etc. In one example, the power converter 600 is a DC-DC converter. In other examples, the power converter is an AC-DC converter.

The boost power converter 600 of FIG. 6 also includes a current sensor 612 coupled to the switching node 604 to sense the inductor current when the switch 610 is turned on. In one example, the current sensor 612 is or includes a sense FET coupled to the switch 610, for example, with a size ratio of 1000 or more. A comparator 614 includes a first (e.g., non-inverting or "+") input 616 connected to an output of the current sensor 612. The comparator 614 also includes an inverting (e.g., "−") input 618, and an output 619 that provides a current limit signal CUR_LIM. The inverting input 618 of the comparator 614 is coupled to an output of a peak current reference circuit 620. The current reference circuit 620 has N+1 current reference inputs respectively coupled to the N+1 second decoder outputs 131-135 of the voltage detector 100. In this configuration, the second decoder output 136 of the voltage detector 100 selects a current reference signal of the current reference circuit 620 used by the comparator 614. The comparator 614 compares the current feedback signal from the current sensor 612 with the selected reference current from the current reference circuit 622 generate the current limit signal CUR_LIM at the comparator output 619.

The power converter 600 also includes a controller 622 that includes an input coupled to the output 619 of the converter comparator 614, and an output 624 coupled to provide a switching control signal SC through a driver circuit 626 to the control input 611 of the switch 610. In one example, a second comparator 630 includes a first (e.g., non-inverting) input 632 that is coupled to an intermediate node that joins resistor 634 and 636 connected with one another between the switch node 604 and the reference node. A second input (e.g., inverting) of the second comparator 630 is connected to a second intermediate node that joins resistor 640 and 642 connected in series with one another between the converter output and the reference node. The comparator 630 has an output 639 that provides a switch to turn off signal TOFF to a second input of the controller 622. In one example, the second comparator 630 operates as a zero-crossing detector with respect to the inductor current IIND, to cause the turn off signal TOFF to turn the converter switch 610 off. A third comparator 644 has a first input 646 (e.g., non-inverting) coupled to receive a voltage reference signal VREF, and a second input 648 coupled to the second input 638 of the second comparator 630. The third comparator 644 has an output 649 that provides a high output signal BST_HI to a third input of the controller 622, for example, in response to the boost converter output voltage VBST exceeding a target or setpoint value set by the reference voltage VREF.

Figure 7:
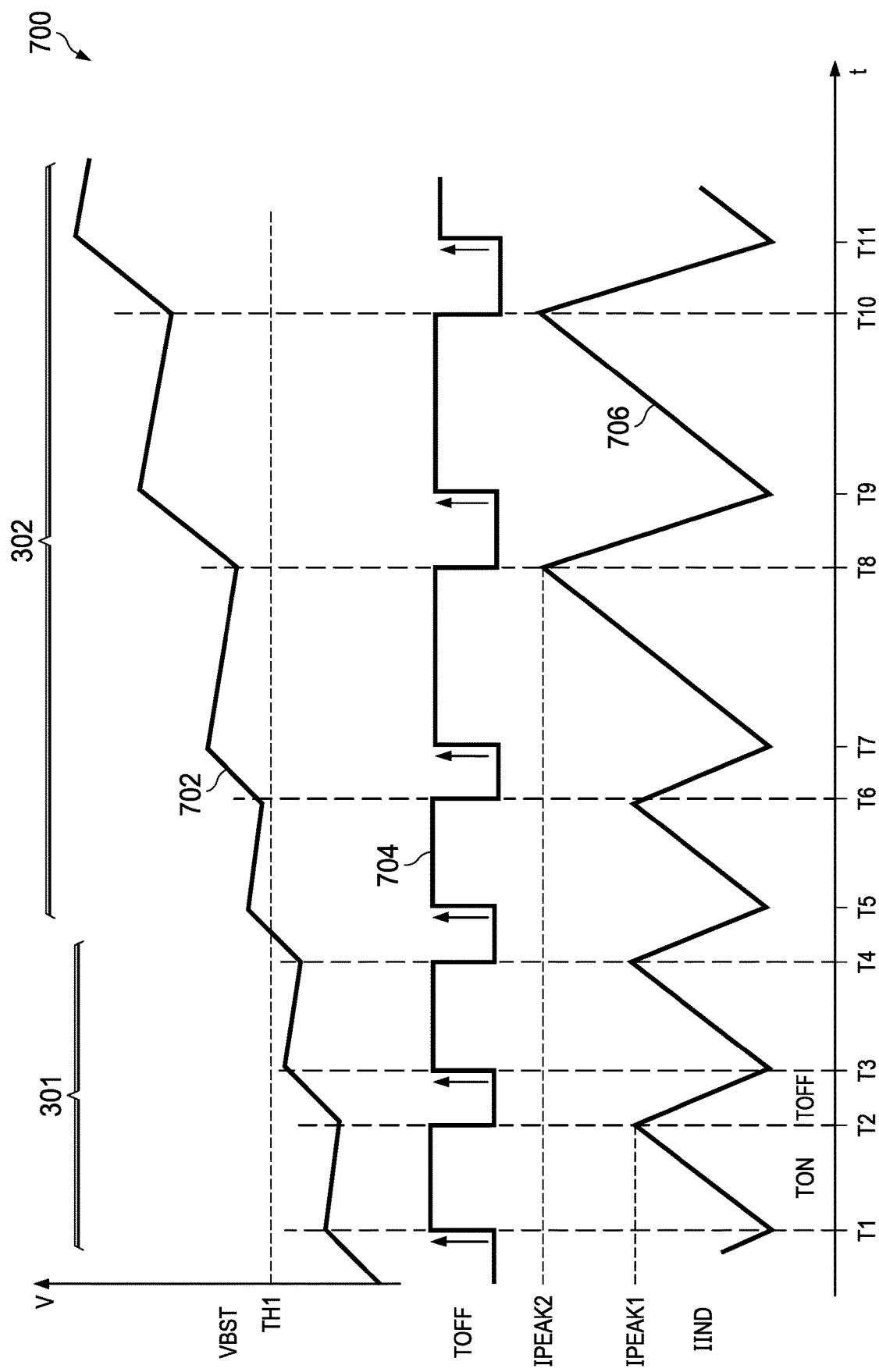
FIGS. 7-9 are diagrams of signals in the power converter of FIG. 6.
Figure 8:
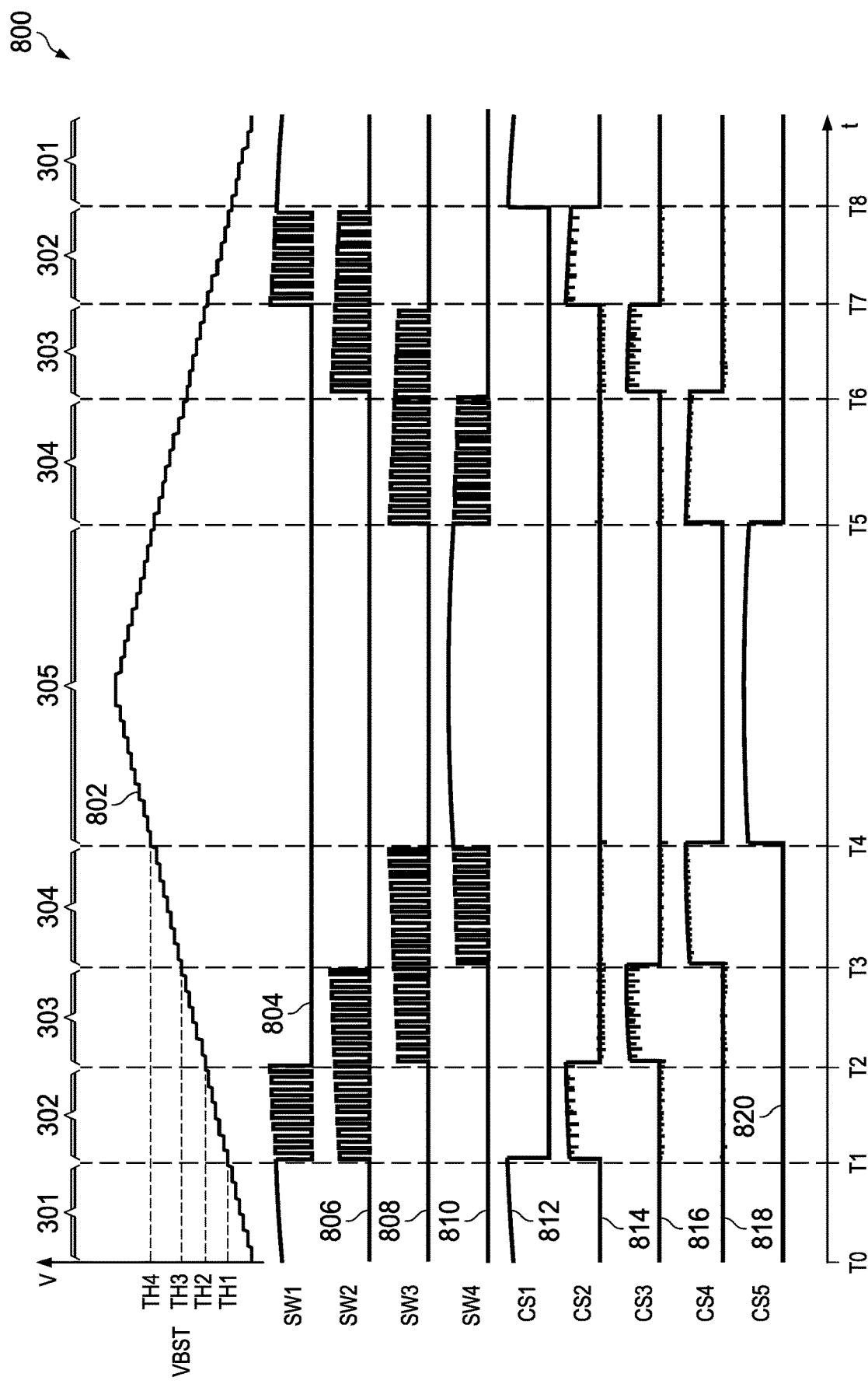
Figure 9:
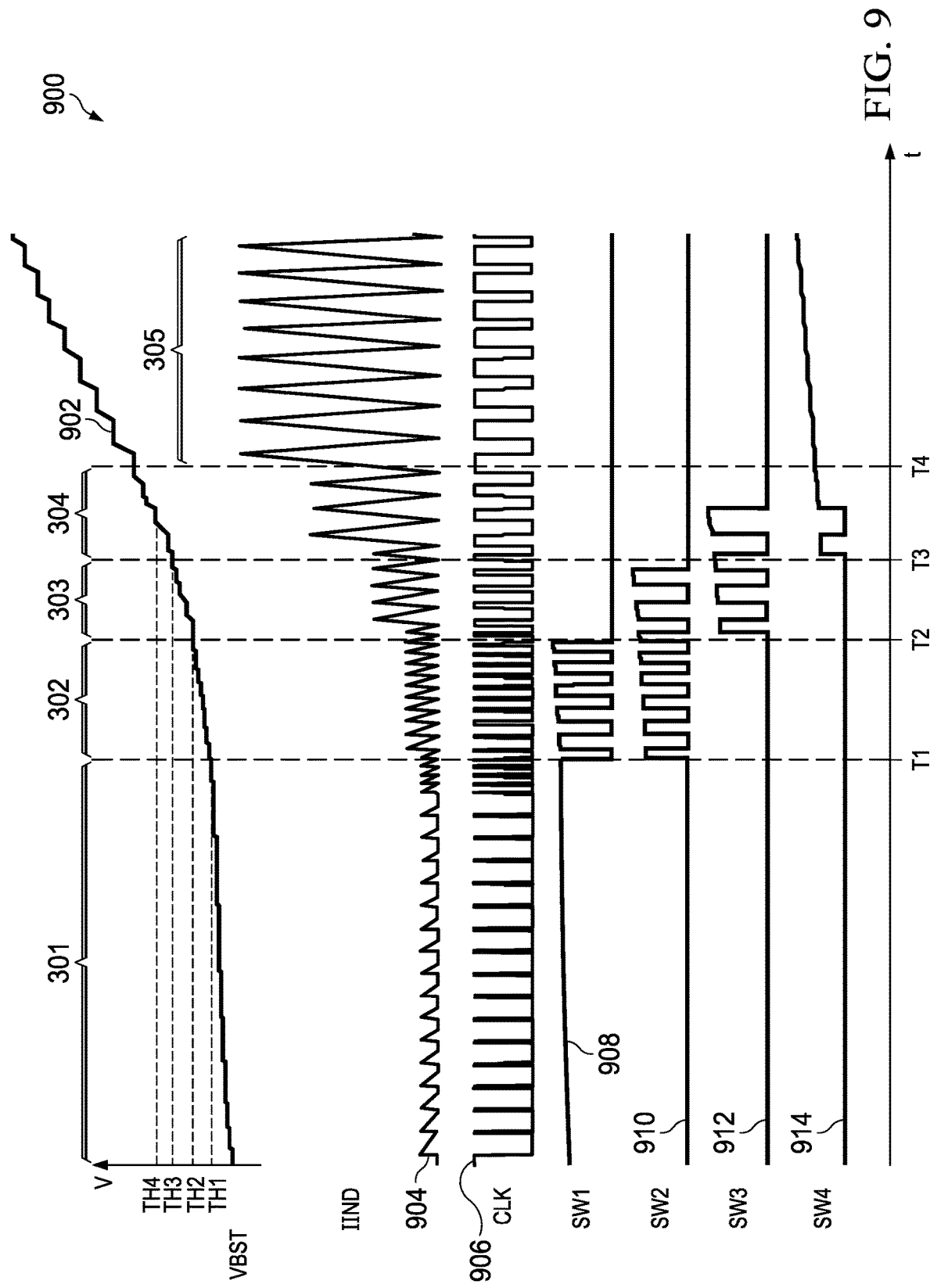

Referring also to FIGS. 7-9, the controller 622 activates the switching control signal SC to turn the switch 610 on each switching control cycle of the boost power converter 600 in response to the current limit signal CUR_LIM from the first comparator 614, and turns the switch 610 off in response to a rising edge of the turn off signal TOFF from the second comparator 630. FIG. 7 shows a graph 700 having a first curve 702 showing the boost converter output voltage VBST as a function of time during operation of the power converter 600. A curve 704 shows the turn off signal TOFF, and a curve 706 shows the inductor current IIND. At time T1, with the voltage detector 100 operating in the first current select state 301, the turn off signal (curve 704) undergoes a rising transition caused by the second comparator 630, and the controller 622 turns the converter switch 610 off. In response, the inductor current (curve 706) rises and the converter output voltage VBST decreases. The controller 622 turns the converter switch 610 on again at time T2, causing the inductor current curve 7062 decrease while the output voltage curve 702 increases. This switching operation continues at times T3 and T4, after which the rising output voltage curve 702 exceeds the first threshold TH1. This causes the state machine 110 of the voltage detector 100 to assert the second current select decoder output 132 (current select signal CS2=1), and the voltage detector 100 operates in the second current select state 302. This increases the output of the current reference circuit 622 provided to the inverting input 618 of the first comparator 614. At time T5, the controller 622 again turns off the converter switch 610, and the switching operation continues at T7, T8, T9, T10 and T11 with the first comparator 614 monitoring for transitions above a second threshold (not shown in FIG. 7).

FIG. 8 shows a graph 800 of various signals in the power converter 600 is a function of time, in which the converter 600 has a changing output voltage VBST and the state machine 110 of the voltage detector 100 transitions through five current select states 301, 302, 303, 304, and 305 as a function of time. In one example, the state machine 110 of the voltage detector 100 operates using a clock source with a fixed frequency. The graph 800 includes a first curve 802 that shows the converter output voltage VBST, and curves 804, 806, 808, and 810 that show the respective switching control signals SW1, SW2, SW3, and SW4 provided by the first decoder 120 in FIG. 1. The graph 800 also includes curves 812, 814, 816, 818, and 820 that show the respective current select signals CS1, CS2, CS3, CS4, and CS5 provided by the second decoder 130. The graph 800 begins from T0 through T1 in the first current select state 301, in which SW1 and CS2 are active (curves 804 and 812, respectively).

At time T1 in FIG. 8, VBST exceeds the first threshold TH1, the state machine 110 transitions the second decoder 132 the second current select state 302, and the first decoder 120 switches back and forth between its first and second states (alternately activating SW1 and SW2). In this example, at time T2, VB ST exceeds the second threshold TH2, and the second decoder 130 transitions into the third current select state 303, in which the first decoder 120 alternately activates SW2 and SW3. At T3, the converter output voltage VBST exceeds the third threshold TH3, which causes the second decoder 130 to thereafter operate in the fourth current select state 304, and the first decoder 120 to alternately activates SW3 and SW4. At T4 in this example, the converter output voltage VBST exceeds the fourth threshold TH4, and the state machine 110 causes the decoders 130 and 120 to operate in the fifth current select state 305 with the fourth switching control signal SW4 activated.

The graph 800 further illustrates operation for steadily decreasing VBST, where VBST falls below the fourth threshold TH4 at T5, leading to the second decoder 130 operating again in the fourth current select state 304, and the first decoder 120 alternately activating SW3 and SW4. At T6, VBST falls below the third threshold TH3. In response, the second decoder 130 transitions into the third current select state 303, and the first decoder 120 alternately activates SW2 and SW3. At T7, the converter output voltage VBST falls below the second threshold TH2, leading to the second decoder 130 transitioning into the second current select state 302, and the first decoder 120 alternately activating SW1 and SW2. At T8, the converter output voltage falls below the first threshold TH1, which causes the second decoder 130 to transition into the first current select state 301, and the first decoder 120 to activate the first switching control signal SW1.

FIG. 9 shows a graph 900 of signals and the power converter 600 for an increasing output voltage VBST. In this example, the boost converter low side turn off signal TOFF is used as the clock signal CLK for the state machine 110 of the voltage detector 100. This allows the voltage detector 100 to operate autonomously without requiring a separate clock source. The graph 900 includes operation over time in the current select states 301, 302, 303, 304, and 3054 gradually increasing VBST shown in a curve 902. A curve 904 shows the inductor current IIND, and a curve 906 shows the clock signal (e.g., TOFF or CLK) in the state machine 110. Curves 908, 910, 912, and 914 in FIG. 9 show the respective switching control signals SW1, SW2, SW3, and SW4 provided by the first decoder 120. In this example, the boost converter output voltage VBST (curve 902) transitions above the first threshold TH1 at time T1, and transitions above the second threshold TH2 at time T2. With each threshold transition, the second decoder output 136 of the voltage detector 100 selects a progressively higher reference current from the reference current circuit 624 comparison with the current feedback signal from the current sensor 612 in FIG. 6. At T3 in FIG. 9, VB ST exceeds the third threshold TH3, and thereafter exceeds the fourth threshold TH4 at time T4.

Modifications are possible in the described examples, and other implementations are possible, within the scope of the claims.

What is claimed is:

1. A method, comprising:
receiving a voltage from a power converter;
generating a comparison result representing a comparison between the voltage and multiple voltage ranges; and
providing a current reference based on the comparison result to the power converter.

2. The method of claim 1, wherein the voltage is a first voltage, the comparison result is a first comparison result between the first voltage and a first voltage range of the multiple voltage ranges, the current reference is a first current reference, and the method further comprises:
receiving a second voltage from the power converter;
responsive to the first comparison result having a first state:
providing the first current reference to the power converter representing a first current level;
generating an updated first comparison result representing a comparison between the second voltage and the first voltage range; and
responsive to the updated first comparison result having a second state:
providing a second current reference to the power converter, in which the second current reference represents a second current level higher than the first current level; and
generating a second comparison result representing a comparison between the second voltage and a second voltage range of the multiple voltage ranges, the second voltage range being higher than the first voltage range.

3. The method of claim 2, wherein the updated first comparison result is a first updated first comparison result, and the method further comprises:
receiving a third voltage from the power converter; and
responsive to the second comparison result having the first state, generate a second updated first comparison result representing a comparison between the third voltage and the first voltage range, and providing one of the first or second current references responsive to the second updated first comparison result.

4. The method of claim 2, further comprising:
receiving a third voltage from the power converter; and
responsive to the second comparison result having the second state:
providing a third current reference representing a third current level higher than the second current level; and
generating a third comparison result representing a comparison between the third voltage and a third voltage range of the multiple voltage ranges, the third voltage range being higher than the second voltage range.

5. The method of claim 4, further comprising:
receiving a fourth voltage from the power converter; and
responsive to the third comparison result having the first state, generating an updated second comparison result representing a comparison between the fourth voltage and the second voltage range, and providing one of the second or third current references based on the updated second comparison result.

6. The method of claim 4, further comprising:
receiving a fourth voltage from the power converter; and
responsive to the third comparison result having the second state:
generating an updated third comparison result representing a comparison between the fourth voltage and the third voltage range; and responsive to the updated third comparison result, providing one of the third current reference or a fourth current reference to the power converter, in which the fourth current reference represents a fourth current level higher than the third current level.

7. The method of claim 4, further comprising:
receiving a fourth voltage from the power converter; and
responsive to the third comparison result having the second state:
providing a fourth current reference representing a fourth current level higher than the third current level; and
generating a fourth comparison result representing a comparison between the fourth voltage and a fourth voltage range of the multiple voltage ranges, in which the fourth voltage range is higher than the third voltage range.

8. The method of claim 7, further comprising:
receiving a fifth voltage from the power converter; and
responsive to the fourth comparison result having the second state:
generating an updated fourth comparison result representing a comparison between the fifth voltage and the fourth voltage range; and
responsive to the updated fourth comparison result, providing one of the fourth current reference or a fifth current reference representing a fifth current level higher than the fourth current level.

9. The method of claim 7, further comprising:
receiving a fifth voltage from the power converter; and
responsive to the fourth comparison result having the first state:
generating an updated third comparison result representing a comparison between the fifth voltage and the third voltage range; and
providing one of the third or fourth current references responsive to the updated third comparison result.

10. The method of claim 2, wherein:
generating a first comparison result representing a comparison between the first voltage from a power converter and a first voltage range comprises:
scaling down the first voltage by a first ratio; and
comparing the scaled first voltage with a reference voltage to generate the first comparison result; and
generating a second comparison result representing a comparison between the second voltage and a second voltage range comprises:
scaling down the second voltage by a second ratio; and
comparing the scaled second voltage with the reference voltage to generate the second comparison result.

11. The method of claim 10, wherein scaling down the first voltage by a first ratio comprises providing the first voltage to a resistive divider having multiple outputs, and connecting a first output of the multiple outputs of the resistive divider to a first input of a comparator; and
wherein scaling down the second voltage by a second ratio comprises providing the second voltage to the resistive divider, and connecting a second output of the multiple outputs of the resistive divider to the first input of a comparator.

12. The method of claim 1, wherein the current reference represents a peak current limit of the power converter.

13. The method of claim 12, further comprising:
sensing a current of the power converter;
generating a current limit signal based on comparing the current with the current reference; and
turning on a switch of the power converter responsive to the current limit signal.

14. The method of claim 1, wherein the voltage is received from an output of the power converter.

15. The method of claim 1, wherein the power converter is a boost converter.

16. An apparatus comprising:
a voltage detector having a voltage detection input and a control output, the voltage detection input coupled to a power converter, and the voltage detector configured to:
receive a voltage at the voltage detection input;
generate a comparison result representing a comparison between the voltage and multiple voltage ranges; and
generate a control signal based on the comparison result;
a current reference circuit having a control input and a current reference output, the control input coupled to the control output, the current reference output coupled to the power converter, and the current reference circuit configured to:
receive the control signal at the control input; and
provide a current reference based on the control signal.

17. The apparatus of claim 16, wherein the voltage is a first voltage, the control signal is a first control signal, the comparison result is a first comparison result between the first voltage and a first voltage range of the multiple voltage ranges, the current reference is a first current reference representing a first current level, and the voltage detector is configured to:
receive a second voltage at the voltage detection input; and
responsive to the first comparison result having a first state:
provide the first control signal at the control output;
generate an updated first comparison result representing a comparison between the second voltage and the first voltage range; and
responsive to the updated first comparison result having a second state:
provide a second control signal at the control output; and
generate a second comparison result representing a comparison between the second voltage and a second voltage range higher than the first voltage range; and
wherein the current reference circuit is configured to provide the first current reference responsive to the first control signal and provide a second current reference responsive to the second control signal, the second current reference representing a second current level higher than the first current level.

18. The apparatus of claim 17, wherein the voltage detector includes:
a resistive divider having multiple outputs; and
a comparator having a first input and a second input, the second input coupled to a reference voltage; and
wherein the voltage detector is configured to:
generate the first comparison result by providing the first voltage to the resistive divider and connecting a first output of the multiple outputs of the resistive divider to the first input of the comparator; and
generate the second comparison result by providing the second voltage to the resistive divider and connecting a second output of the multiple outputs of the resistive divider to the first input of the comparator.

19. The apparatus of claim 16, wherein the current reference represents a peak current limit of the power converter.

20. The apparatus of claim 16, further comprising a power converter switch controller having a current sense input, a current limit input, and a switch control output, the current limit input coupled to the current reference output.

* * * * *